United States Patent [19]

Morcom

[11] 4,213,065
[45] Jul. 15, 1980

[54] DEVICE FOR PROVIDING A SELECTIVELY VARIABLE PROPORTION OF AN ELECTRICAL SIGNAL

[75] Inventor: Richard Morcom, London, England

[73] Assignee: Hughes Microelectronics Limited, Fife, Scotland

[21] Appl. No.: 886,200

[22] Filed: Mar. 13, 1978

[30] Foreign Application Priority Data

Mar. 15, 1977 [GB] United Kingdom ............... 10962/77

[51] Int. Cl.² ............................................ H03K 17/68
[52] U.S. Cl. .................................... 307/251; 307/265; 307/229
[58] Field of Search ............... 307/251, 229, 254, 230, 307/265; 328/145

[56] References Cited

U.S. PATENT DOCUMENTS

| 3,466,526 | 9/1969 | Cole | 307/251 |
| 3,488,520 | 1/1970 | Hunter | 307/251 |
| 3,631,528 | 12/1971 | Green | 307/251 |

FOREIGN PATENT DOCUMENTS 1326105 8/1973 United Kingdom.

Primary Examiner—Stanley D. Miller, Jr.
Assistant Examiner—B. P. Davis
Attorney, Agent, or Firm—Lawrence V. Link, Jr.; W. H. MacAllister

[57] ABSTRACT

A device for providing a selectively variable proportion of an electrical signal, which can be used instead of a conventional resistive track potentiometer, is disclosed. The device comprises two switching devices, typically CMOS transmission gates, connected in series between two inputs for receiving the electrical signal, an output at the series connection of the switching devices, and a control circuit for cyclically switching the switching devices between high and low conductivity states. The control circuit is so arranged that when one of the switching devices is in its high conductivity state, the other is in its low state and vice versa, and the control circuit is arranged to control selectively the relative durations that the devices remain in their different conductivity states. A filter is connected to the output and in use, the output signal from the filter is of the same general waveform as the signal applied to the inputs but of a magnitude determined by the selected relative durations of the high and low conductivity states, determined by the control circuit.

12 Claims, 6 Drawing Figures

DEVICE FOR PROVIDING A SELECTIVELY VARIABLE PROPORTION OF AN ELECTRICAL SIGNAL

FIELD OF THE INVENTION

This invention relates to a device for providing a selectively variable proportion of an electrical signal and relates especially to a device that can be used instead of a conventional resistive track potentiometer.

BACKGROUND TO THE INVENTION

Resistive track potentiometers are well known and are used in a multitude of different applications. However, a disadvantage of such potentiometers is that they require mechanical movement of a slider along a track and hence they are susceptible to mechanical wear. Moreover, they are not readily disposed to be driven automatically or from a remote location.

SUMMARY OF THE INVENTION

It is an object of the present invention to provide a device for providing a selectively variable proportion of an electrical signal, which can be used instead of a conventional resistive track potentiometer.

It is another object of the invention to provide a device for providing a selectively variable proportion of an electrical signal which can be driven automatically or from a remote location and which need not include moving parts.

These objects and others are accomplished by means of a device in accordance with the present invention which comprises first and second switching means each for being switched between relatively high and low conductivity states, said switching means being connected together at an output of the device and being connected in series between inputs for receiving said electrical signal, and a control means including means arranged to operate the switching means cyclically between said high and low states such that when one of said switching means is in its high conductivity state the other said switching means is in its low conductivity state, and means for controlling selectively the relative durations that the devices remain in said high and low conductivity states.

In use of a device in accordance with the invention, a low pass filter is connected to the output to provide an output filtered signal which is of the same general waveform as the input signal but of an amplitude determined by the relative durations of said conductivity states.

Preferably, the switching means comprise CMOS transmission gates which are controlled by a control signal of rectangular waveform produced by the control means, the control signal having a selectively variable mark to space ratio which determines the relative durations of the different conductivity states of the gates; this preferred arrangement can be manufactured on an integrated circuit chip, the chip being controlled by for example touch plate switches which permit the mark to space ratio of the control signal to be changed selectively. The chip can be used instead of a conventional resistive track potentiometer, and thus the present invention provides a device which performs the function of a conventional potentiometer but with no moving parts.

The device can be arranged to have a linear or a non-linear, for example logarithmic, characteristic.

BRIEF DESCRIPTION OF THE DRAWINGS

In order that the invention may be more fully understood and readily carried into effect, an embodiment thereof will now be described by way of illustrative example with reference to the accompanying drawings in which.

DESCRIPTION OF PREFERRED EMBODIMENT

Figure 1:
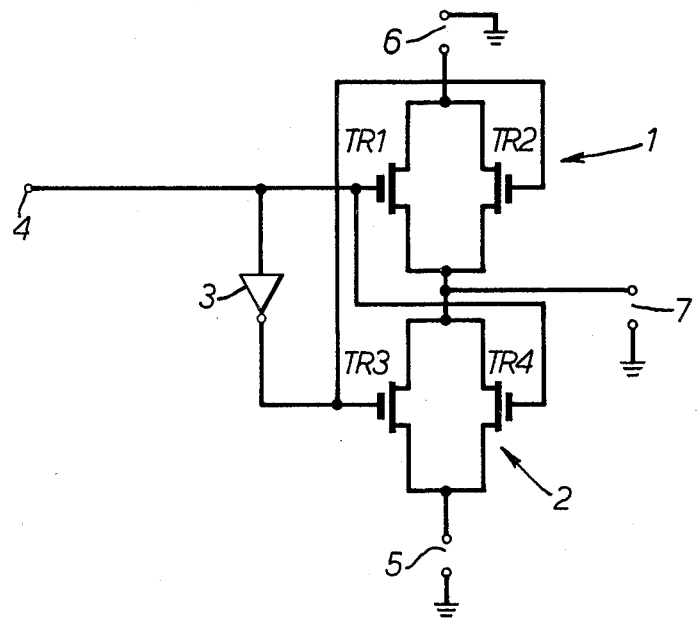
FIG. 1 is a schematic circuit diagram of a device in accordance with the present invention.

Referring firstly to FIG. 1, the device comprises two semiconductor switching means in the form of CMOS transmission gates 1 and 2 connected in series and connected through an inverter 3 to receive a control signal from a signal generator (not shown) which controls the gates in such a manner that when one of the transmission gates is switched on, the other is switched off.

The transmission gate 1 comprises an N-channel MOS transistor TR1 and a P-channel transistor TR2, the gate 2 comprising an N-channel transistor TR3 and a P-channel transistor TR4. The gates of transistors TR1 and TR4 are connected directly to an input terminal 4 which receives the control signal. The gates of transistors TR2, TR3 receive an inversion of the control signal produced by the inverter 3. Input voltages $V_1$ and $V_2$ are applied to the terminals 5 and 6 respectively, and an output voltage $V_o$ is developed at terminals 7 connected to the series connection of the gates 1 and 2.

Figure 2:
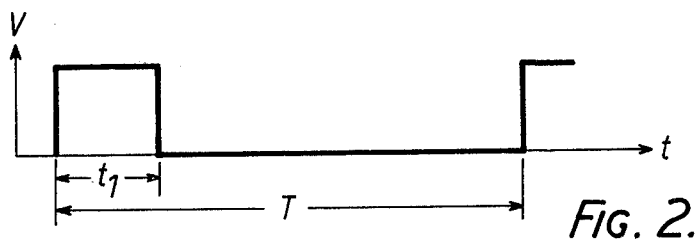
FIG. 2 is a graph of one cycle of a control waveform A for operating the device of FIG. 1.

The control signal has a rectangular waveform, one cycle of which is shown in FIG. 2, and is arranged to control the relative durations that the gates 1 and 2 are switched on. Thus, the gate 1 is switched on during the period $t_1$ and is switched off for the remaining period $(T-t_1)$ of the cycle. Conversely, the gate 2 is switched off for the period $t_1$, and on for the period $(T-t_1)$. The control signal has a constant frequency but its mark to space ratio is selectively variable so as to vary the duration of $t_1$ between O and T.

Thus, the output voltage $V_o$ for the cycle is given by $$V_o = \frac{1}{T} \left[ \int_0^{t_1} V_1 dt + \int_{t_1}^{T} V_2 dt \right]$$

Integration of the output signal $V_o$ is performed by a low pass filter (not shown) connected to the output 7 and hence the output $V_{OF}$ of the filter is given by $$V_{OF} = \frac{V_1 t_1 + V_2(T - t_1)}{T}$$

$$V_2 + (V_1 - V_2)\frac{t_1}{T}$$

This voltage is of the same form as the output from the slider of a conventional resistive track potentiometer having voltages $V_1$ and $V_2$ applied to opposite ends of its resistive track, the ratio $t_1/T$ corresponding to the position of the slider along the track. Thus by varying the mark to space ratio of the control signal, the magnitude of the voltage $V_o$ can be controlled selectively, and when $t_1$ is varied from O to T, the magnitude of $V_{OF}$ varies between $V_2$ and $V_1$.

Figure 3:
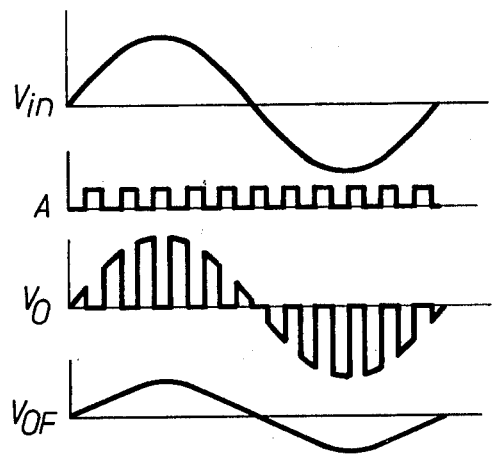
FIGS. 3 and 4 are graphs of various waveforms developed in use of the device of FIG. 1.
Figure 4:
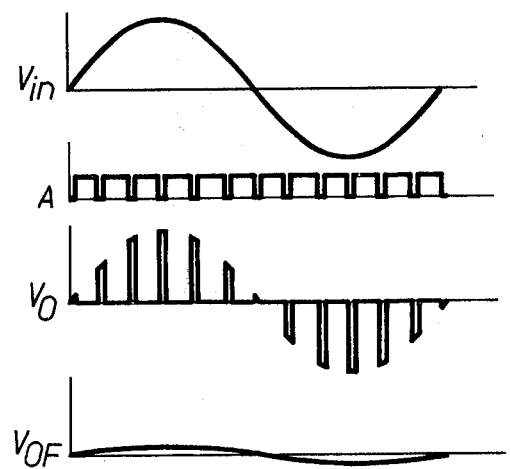

Operating waveforms of the device are shown in FIGS. 3 and 4, for an alternating input waveform $V_{in}=(V_1-V_2)$ and a control waveform A, the device providing an output waveform $V_o$ and a filtered output waveform $V_{OF}$.

In FIG. 3, the control signal A has equal duration marks and spaces, and the output signal $V_{OF}$ is of half the amplitude of $V_{in}$. However, in FIG. 4, the control signal consists substantially only of marks, and as a result, the amplitude of $V_{OF}$ is much less than that of $V_{in}$.

The device described with reference to FIG. 1 corresponds to a linear potentiometer and the output voltage $V_{OF}$ is a linear function of the mark to space ratio of the control signal A. Such a linear device has particular application in audio signal amplifiers for controlling bass and treble filters. The device can also be used in multi-channel amplifiers for controlling balance of the channels. For volume control in an amplifier, it is however desirable to use a device having a logarithmic response and a device having a logarithmic response will now be described with reference to FIG. 5.

Figure 5:
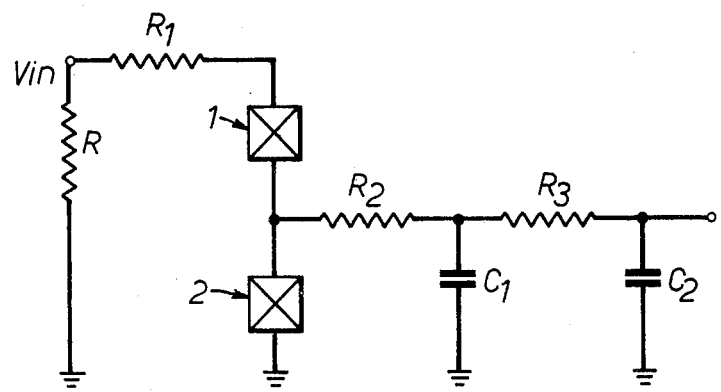
FIG. 5 illustrates a modification of the device of FIG. 1.

The device of FIG. 5 includes the transmission gates 1 and 2 which are shown schematically and are arranged to be switched on and off in response to the control signal A as previously described. The input voltage $V_{in}$ is applied through a resistor $R_1$ to the gate 1, and the output $V_o$ is derived through a resistor $R_2$ and a capacitor $C_1$. A low pass filter comprising a resistor $R_3$ and a capacitor $C_2$ provides the filtered output $V_{OF}$.

In operation, when the gate 1 is switched on, the capacitor $C_1$ is charged in response to the input signal $V_{in}$ through the resistors $R_1$ and $R_2$, but when the gate 2 is switched on, the capacitor is discharged through the resistor $R_2$ alone. This differential charging and discharging of the capacitor $C_1$ introduces an exponential term into the voltage $V_o$ thus giving the device a non-linear control characteristic which whilst not as truly logarithmic as high quality conventional logarithmic resistive track potentiometers, is sufficiently accurate for volume control purposes in audio amplifiers.

To prevent the control signal from introducing distortion into the output signal $V_{OF}$, the frequency of the control signal is selected to be much greater than the maximum frequency likely to occur in the input frequency $V_{in}$; in fact, it will be appreciated by those skilled in the art that frequency of the control signal A must be at least twice the maximum frequency of $V_{in}$ to prevent any loss of information in the output signal $V_{OF}$. When devices of the invention are used in a stereo f.m. tuner amplifier, a multiple of the stereo multiplex frequency (usually 38 KHz) can be used as the frequency of the control signal, so as to avoid beats between the multiplex frequency and the control signal.

Figure 6:
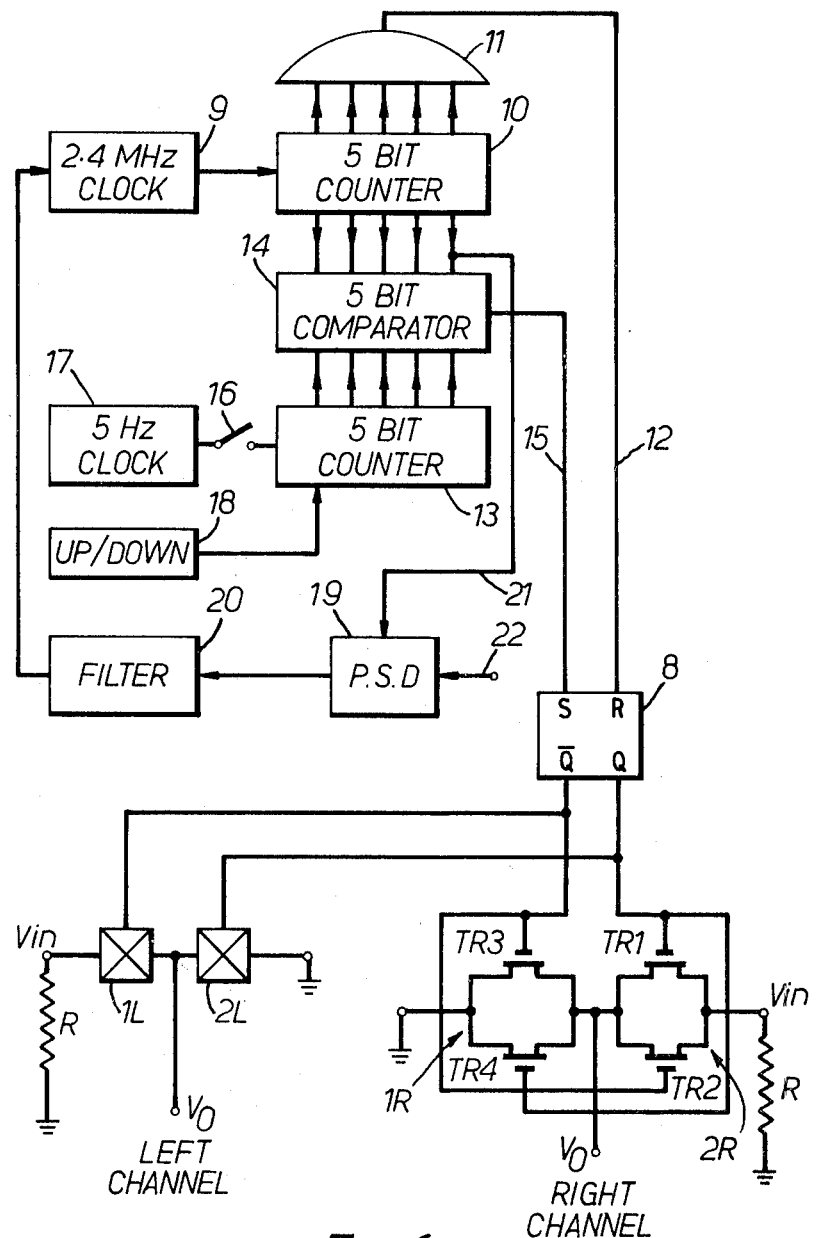
FIG. 6 illustrates a practical form of device in accordance with the present invention, for use in a stereo f.m. tuner.

A practical example of the device of the invention for use as a volume control in an f.m. stereo tuner-amplifier will now be described with reference to FIG. 6. The device includes first and second pairs of series connected transmission gates 1R, 2R, 1L, 2L which are used respectively to control the volume of right and left channels in the amplifier in the manner previously described. The gates for the left hand channel are shown schematically, but correspond to the gates for the right hand channel which are shown in detail, and the pairs of gates are connected to be driven by a common control signal A produced from a bistable 8.

The bistable 8 is switched between its two states by means of a counter arrangement driven by clock pulses from a voltage controlled 2.4 MHz oscillator 9. The counter arrangement includes a first five bit counter 10 that cyclically counts pulses from the generator 8 to define the periodicity T of the control signal A and to this end, an AND gate 11 having inputs connected to the five bit stages of the counter 10 is arranged to provide an output on a line 12 to reset the bistable 8 each time the counter 10 is filled completely with clock pulses. A second five bit counter 13 is arranged to store a selectively variable count which determines the mark to space ratio of the control signal. The count held by the counter 13 is compared with the continuously varying count in the first counter 10 by a comparator 14. When the count in the counter 10 is equal to that held by counter 13, the comparator 14 provides an output on line 15 which sets the bistable 8 and thus the control signal A has a mark to space ratio determined by the count held in the counter 13.

The count in counter 13 can be varied by operation of a switch 16 which gates clock pulses from a 5 Hz clock 17 into the counter. The counter 13 is arranged to be incremented or decremented by an up/down control 18. Thus the five bit counter 13 permits the volume to be increased or decreased in 31 incremental steps.

The frequency of the voltage controlled oscillator 9 is held constant by means of a phase locked loop that includes a phase sensitive detector 19 and an attendant smoothing filter 20, that compares the phase of a control signal derived from the most significant bit of the counter 10 on line 21, with the phase of a 76 KHz stereo multiplex oscillator signal fed on line 22 from the stereo decoder of the tuner, thereby avoiding the aforementioned beats.

Each pair of gates 1, 2 is provided with a respective low pass filter and capacitive network of the kind shown in FIG. 5, to provide an output $V_{OF}$ for each channel, with a logarithmic response. Clearly, however the arrangement can be used for bass, treble and balance controls if non logarithmic response filters are used. The arrangement shown in FIG. 5 is ideally suited to manufacture as an integrated circuit on a single chip, with the switch 16 and the up/down control 18 being operated by means of touch plate switches or by a remote control device utilising an infra-red or ultra sonic transmitter as is now used in domestic television receivers. Thus, the arrangement described with reference to FIG. 5 can perform the function of a conventional resistive track potentiometer and has the advantage of having no moving parts.

I claim:

1. A device for providing a selectively variable proportion of an electrical signal comprising:
   (a) first and second inputs for receiving said signal;
   (b) first and second switching means each for being switched between relatively high and low conductivity states for alternating as well as direct current voltages and being connected in series between said inputs;

(c) an output connected to the series connection of said switching means; and (d) control means for controlling the conductivity states of said switching means and including means arranged to operate said switching means cyclically between said high and low states such that when one of said switching means is in its high conductivity state the other of the switching means is in its low conductivity state, and means for controlling selectively the relative durations that said switching means remain in said high and low conductivity state.

2. A device in accordance with claim 1 wherein the control means includes means for generating an electrical signal of a rectangular waveform, and means adapted to vary selectively the mark to space ratio of said waveform, one of said switching means being arranged to be in its relatively high and low conductivity states in response to the marks and spaces respectively of said waveform and the other of said switching means being arranged to be in its relatively high and low conductivity states in response to the spaces and marks of said signal respectively.

3. A device in accordance with claim 2 wherein said switching means comprise CMOS transmission gates, each said gate including a p-channel transistor and an n-channel transistor which have respective gate electrodes, the p-channel transistor of one of the gates and the n-channel transistor of the other of the gates having their gate electrodes connected to receive said rectangular waveform, an inverter arranged to invert said rectangular waveform, the other p-channel transistor and the other n-channel transistor having their gate electrodes connected to said inverter.

4. A device for producing a selectively variable portion of an electrical signal, comprising:
(a) first and second inputs for receiving said signal;
(b) first and second switching means each for being switched between relatively high and low conductivity states for alternating as well as direct current electrical signals and being connected in series between said inputs;
(c) an output connected to the series connection of said switching means;
(d) control means for controlling the conductivity states of said switching means and including means arranged to operate said switching means cyclically between said high and low states such that when one of said switching means is in its high conductivity state the other of the switching means is in its low conductivity state, and means for controlling selectively the relative durations that said switching means remain in said high and low conductivity states; and
(e) a filter connected to said output and arranged to smooth from the signal developed at said output, transients of the frequency at which said switching means are cyclically switched between said states.

5. A device in accordance with claim 4 wherein the control means includes means for generating an electrical signal of a rectangular waveform, and means adapted to vary selectively the mark to space ratio of said waveform, one of said switching means being arranged to be in its relatively high and low conductivity states in response to the marks and spaces respectively of said waveform and the other of said switching means being arranged to be in its relatively high and low conductivity states in response to the spaces and marks of said signal respectively.

6. A device in accordance with claim 5 wherein the filter is so arranged that the amplitude of the smoothed signal produced by the filter is substantially a linear function of the mark to space ratio of said rectangular waveform.

7. A device in accordance with claim 5 wherein the filter is so arranged that the amplitude of the smoothed signal produced by the filter is a logarithmic function of the mark to space ratio of the rectangular waveform.

8. A device in accordance with claim 5 wherein the control means comprises a clock pulse generator, a first counter arranged to count pulses produced by the clock pulse generator, a bistable for producing said rectangular waveform, means adapted to cause said bistable to assume a first of its stable states in response to a predetermined count becoming accumulated in said first counter, a second counter, means arranged to establish a selectively variable count in said second counter, and a comparator arranged to cause the bistable to assume the second of is stable states when the count in said first counter assumes a predetermined relationship to the count established in the second counter.

9. A device in accordance with claim 8 wherein said means arranged to establish a count in said second counter comprises a clock pulse generator for connection to the second counter, a switch arranged to connect the clock pulse generator to the second counter selectively, and means for causing the counters to count upwardly or downwardly in response to pulses from the generator connected thereto.

10. A device in accordance with claim 9 wherein said switch comprises a touch plate switch.

11. A device in accordance with claim 9 wherein said switch is controlled by a remote control device.

12. A device in accordance with claim 2 adapted to produce said selectively variable proportion of a further electrical signal, and including third and fourth switching means each for being switched between relatively high and low conductivity states, a further output, said third and fourth switching means being connected together at a further output, third and fourth inputs for receiving said further signal, said third and fourth switching means being connected in series between said third and fourth inputs, one of said third and fourth switching means being arranged to be in its relatively high and low conductivity states in response to said marks and said spaces respectively of said control waveform, and the other of said third and fourth switching means being arranged to be in its high and low conductivity states in response to said spaces and said marks respectively.

* * * * *